United States Patent
Nakayama et al.

(10) Patent No.: US 7,985,984 B2
(45) Date of Patent: Jul. 26, 2011

(54) III-NITRIDE SEMICONDUCTOR FIELD EFFECT TRANSISTOR

(75) Inventors: Tatsuo Nakayama, Tokyo (JP); Yuji Ando, Tokyo (JP); Hironobu Miyamoto, Tokyo (JP); Yasuhiro Okamoto, Tokyo (JP); Takashi Inoue, Tokyo (JP)

(73) Assignee: NEC Corporation, Tokyo (JP)

( * ) Notice: Subject to any disclaimer, the term of this patent is extended or adjusted under 35 U.S.C. 154(b) by 159 days.

(21) Appl. No.: 12/528,578

(22) PCT Filed: Feb. 26, 2008

(86) PCT No.: PCT/JP2008/053223
§ 371 (c)(1),
(2), (4) Date: Aug. 25, 2009

(87) PCT Pub. No.: WO2008/105378
PCT Pub. Date: Sep. 4, 2008

(65) Prior Publication Data
US 2010/0038680 A1     Feb. 18, 2010

(30) Foreign Application Priority Data
Feb. 28, 2007    (JP) ................. 2007-049350

(51) Int. Cl.
*H01L 29/778*     (2006.01)
(52) U.S. Cl. ........................ 257/190; 257/194
(58) Field of Classification Search .......... 257/190, 257/194, 282, 281, 471, E29.246
See application file for complete search history.

(56) References Cited

U.S. PATENT DOCUMENTS
6,492,669 B2 * 12/2002 Nakayama et al. ........... 257/282

FOREIGN PATENT DOCUMENTS
| JP | 2002-016087 A | 1/2002 |
| JP | 2002-064201 A | 2/2002 |
| JP | 2003-017419 A | 1/2003 |
| JP | 2003-197645 A | 7/2003 |
| JP | 2004-006461 A | 1/2004 |

OTHER PUBLICATIONS

International Search Report for PCT/JP2008/053223 mailed May 27, 2008.
S. Vitusevich, "Excess Low-Frequency Noise in AlGaN/GaN-based High-Electron Mobility Transistors", Applied Physics Letters, vol. 80, No. 12, Mar. 25, 2002, pp. 2126-2128.

* cited by examiner

*Primary Examiner* — Roy K Potter

(57) ABSTRACT

Provided is a semiconductor device that can reduce the contact resistance, has a small current collapse, and can improve the pinch-off characteristic upon a high-frequency operation. A field effect transistor using a wurtzite (having (0001) as the main plane) type III-nitride semiconductor includes: a substrate (101); an undercoat layer (103) of a first III-nitride semiconductor; and a carrier travel layer (104) of a second III-nitride semiconductor. The undercoat layer (103) (101) and the carrier travel layer (104) is formed on the substrate in this order. The field effect transistor includes source/drain electrodes (105, 106) in ohmic contact, and a gate electrode (107) in Schottky contact directly or via another layer on the carrier travel layer (104). The undercoat layer (103) has an average lattice constant greater than that of the carrier travel layer (104) and a band gap greater than that of the carrier travel layer (104).

9 Claims, 3 Drawing Sheets

III-NITRIDE SEMICONDUCTOR FIELD EFFECT TRANSISTOR

This application is the National Phase of PCT/JP2008/053223, filed Feb. 26, 2008, which is based upon and claims the priority of Japanese Patent Application No. 2007-049350 filed on Feb. 28, 2007, the disclosures of which are incorporated herein by reference.

TECHNICAL FIELD

The present invention relates to a field effect transistor (FET) using a III-nitride semiconductor, and more particularly, to a high electron mobility transistor (HEMT).

BACKGROUND ART

Since a III-nitride semiconductor material having a large bandgap has characteristics of dielectric breakdown electric field having one higher order digit and high maximum electron velocity of two times or more, as compared to GaAs or Si, it is noted as a high power device material of microwave/milimetric wave bands. The HEMT using the material is expected as a high power transistor for next generation wireless communication. However, the materials has the problems of current reduction due to voltage stress (current collapse), gate leakage current, heat generation upon a high power operation and the like, which are causes of breakdown/output voltage decreases or instability. Hence, the most urgent necessity is to solve the above problems, thereby increasing the performance-reliability to an application level.

In the FET structure using a III-nitride semiconductor material, an AlGaN/GaN hetero structure has been typically used which uses piezo-charges by a strained AlGaN layer, so as to supply the carriers.

For example, Vitusevich et al. reported a FET structure in which the AlGaN/GaN layer structure is used to make, as a carrier, two-dimensional electron gas induced by a piezo effect of a strained AlGaN layer (Non-Patent Document 1: Applied Physics Letters vol. 80, No. 12, pp 2126).

FIG. 3 shows a sectional structure of the FET reported by Vitusevich et al. As shown in FIG. 3, on sapphire substrate 301 are deposited $Al_{0.16}Ga_{0.84}N$ nucleation layer 302 having a thickness of 40 nm, GaN layer 303 having a thickness of 1.1 µm, and $Al_{0.33}Ga_{0.67}N$ layer 304 having a thickness of 23 nm. Then, source electrode 305 and Ti/Al/Ti/Au as drain electrode 306 are deposited. Then, heat treatment is performed at 800° C. for 40 seconds. Furthermore, gate electrode 307 made of Ni/Au is formed and $Si_3N_4$ protection film 308 is finally formed. With the structure, electrons induced by the piezo effect of the strained AlGaN layer are accumulated at an interface of GaN layer 303 facing $Al_{0.33}Ga_{0.67}N$ layer 304, so that two-dimensional electron gas (2DEG) is formed.

Non-Patent Document 1: Applied Physics Letters vol. 80, No. 12, pp 2126

DISCLOSURE OF THE INVENTION

Problems to be Solved by the Invention

However, in the AlGaN/GaN structure, since the outermost surface is AlGaN having a great band gap (Schottky barrier height), it is difficult to lower a contact resistance to the ohmic electrodes to 1e-6 $\Omega cm^2$ or less. In addition, when the outermost surface is AlGaN, since it includes Al that is easily oxidizable, the current collapse is high upon a high voltage operation. Furthermore, since the two-dimensional electron gas becomes distant from the AlGaN/GaN interface at a state in which the current is narrowed down near to the pinch-off, the short channel effect is considerable at the gate length of 0.3 micrometers or less, so that the high frequency characteristic is deteriorated.

Means for Solving the Problems

In order to solve the above problems, the inventors found the followings: in a field effect transistor using a wurtzite type III-nitride semiconductor being (0001) plane as a main plane, when an undercoat layer having an average lattice constant greater than that of a carrier travel layer and having a band gap greater than that of the carrier travel layer is provided to a side of the carrier travel layer facing a substrate, a contact resistance to an ohmic electrode can be lowered to 1e-6 $\Omega cm^2$ or less, and two-dimensional electron gas can stay at a side of the carrier travel layer facing the undercoat layer by a barrier of the undercoat layer even at a state in which the current is narrowed down near to the pinch-off, so that the short channel effect can be suppressed.

In other words, the invention relates to a field effect transistor using a wurtzite type III-nitride semiconductor being (0001) plane as a main plane, including: a laminate of at least an undercoat layer of a first III-nitride semiconductor and a carrier travel layer of a second III-nitride semiconductor laminated on a substrate in this order; source/drain electrodes in ohmic contact directly or via another layer and a gate electrode in Schottky contact directly or via another layer. The source/drain electrodes and the gate electrodes are formed on the carrier travel layer. The undercoat layer has an average lattice constant greater than that of the carrier travel layer, and a band gap greater than that of the carrier travel layer.

Effects of the Invention

According to the invention, since the lattice constant of the carrier travel layer is smaller than that of the undercoat layer, the carrier travel layer is subjected to tensile strain so as to apply a piezo effect, negative and positive charges are induced on a surface side of the carrier travel layer and a substrate side thereof, respectively, by the piezo effect. In addition, since the band gap of the carrier travel layer is smaller than that of the undercoat layer, two-dimensional electron gas is formed at an interface between the carrier travel layer and the undercoat layer, so that a reverse HEMT structure is made. As a result, ohmic electrodes contact the carrier travel layer having the lower Schottky barrier height, as compared to the undercoat layer, and there is no barrier up to the two-dimensional electron gas, so that the contact resistance can be reduced.

Furthermore, since a barrier to the electrons is provided to a substrate side of the two-dimensional electron gas, the pinch-off characteristic is improved and the short channel effect can be suppressed upon a high-frequency operation. In particular, contrary to a GaAs-based reverse HEMT structure, since the carrier is induced by the piezo effect of the carrier travel layer itself, it is not necessary to dope the undercoat layer of the carrier travel layer. In addition, even when the reverse HEMT is made, a leak path is not formed in the undercoat layer, so that the breakdown voltage is not decreased.

REFERENCE NUMERALS

Figure 1:
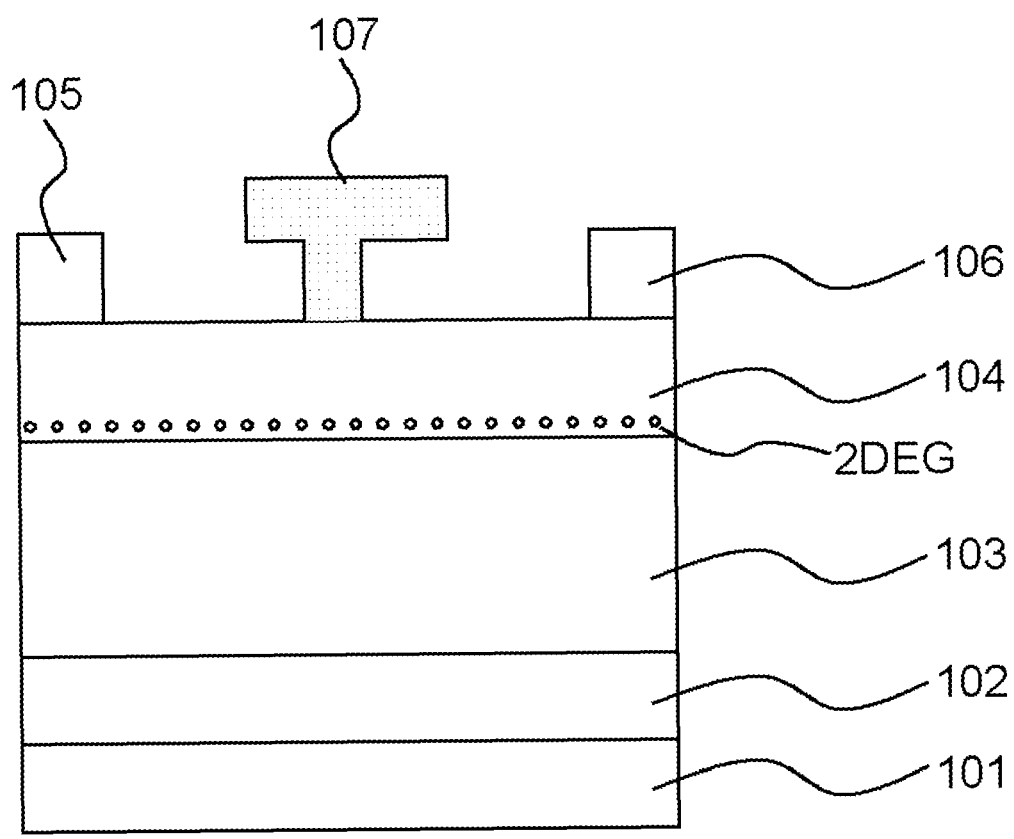
FIG. 1 is a sectional view showing a first exemplary embodiment of the invention.

101: Substrate
102: Buffer layer
103: Undercoat layer comprising a first III-nitride semiconductor
104: Carrier travel layer comprising a second III-nitride semiconductor
105: Source electrode
106: Drain electrode
107: Gate electrode
201: First insulation film
202: Protection film
2DEG: Two-dimensional electron gas

BEST MODE FOR CARRYING OUT THE INVENTION

In the invention, the term "average lattice constant" is a lattice constant that a material has inherently and an average value of an overall layer of lattice constants in a horizontal plane perpendicular to a direction of a layer thickness. In the below descriptions, it is sometimes abbreviated as "lattice constant."

Exemplary embodiments of the invention will be described with reference to the drawings.

First Exemplary Embodiment

FIG. 1 is a sectional view showing a FET structure according to a first exemplary embodiment of the invention. The FET shown in FIG. 1 includes substrate 101 on which buffer layer 102 comprising a III-nitride semiconductor, undercoat layer 103 comprising a first III-nitride semiconductor and carrier travel layer 104 comprising a second III-nitride semiconductor are formed. Then, source electrode 105 and drain electrode 106 are formed. Further, gate electrode 107 is formed between source electrode 105 and drain electrode 106, so that a field effect transistor is thus manufactured.

As substrate 101, sapphire, silicon carbide, GaN, AlN and the like may be used.

As the III-nitride semiconductor constituting buffer layer 102, III-nitride semiconductor such as GaN, InN, AlN and a mixture of two or three species thereof may be used. Further, it may be possible that a nucleation layer comprising III-nitride semiconductor such as GaN, InN, AlN and a mixture of two or three species thereof is formed on substrate 101 and a buffer layer is then formed on the nucleation layer. Buffer layer 102 is provided to relieve lattice mismatch between substrate 101 and undercoat layer 103 and to reduce a density of threading dislocations.

In the III-nitride semiconductor constituting the buffer layer, n-type impurities such as Si, S and Se or p-type impurities such as Be, C and Mg may be added.

The first III-nitride semiconductor constituting undercoat layer 103 may include, for example GaN, InN, AlN or a mixture of two or three species thereof.

In addition, in the first III-nitride semiconductor, n-type impurities such as Si, S and Se or p-type impurities such as Be, C and Mg may be added. At this time, when the impurity concentration in the first III-nitride semiconductor is increased, it causes leakage current, so that the breakdown characteristics is deteriorated. Hence, the impurity concentration is preferably $1 \times 10^{16}$ cm$^{-3}$ or less.

Further, the second III-nitride semiconductor constituting carrier travel layer 104 may include, for example GaN, InN, AlN or a mixture of two or three species thereof. However, in the invention, the second III-nitride semiconductor has a lattice constant and a band gap, which are smaller than those of the first III-nitride semiconductor. Particularly, in order to suppress the current collapse, it is preferable that the second III-nitride semiconductor does not contain Al.

To be more specific, when the second III-nitride semiconductor constituting carrier travel layer 104 is expressed with $In_{x1}Al_{y1}Ga_{z1}N$ (x1+y1+z1=1) and the first III-nitride semiconductor constituting undercoat layer 103 is expressed with $In_{x2}Al_{y2}Ga_{z2}N$ (x2+y2+z2=1), it is preferable to combine materials so that the relations of the equations (1) and (2) are satisfied simultaneously.

$$LP_{In}(x1-x2)+LP_{Al}(y1-y2)+LP_{Ga}(z1-z2)<0 \qquad (1)$$

$$BG_{In}(x1-x2)+BG_{Al}(y1-y2)+BG_{Ga}(z1-z2)<0 \qquad (2)$$

(In the above equations, $LP_{In}$, $LP_{Al}$ and $LP_{Ga}$ denote the lattice constants of InN, AlN and GaN, respectively and $BG_{In}$, $BG_{Al}$ and $BG_{Ga}$ indicate the band gap energies of InN, AlN and GaN, respectively.)

Regarding the lattice constant and the band gap energy, although there are differences depending on literatures, the invention adopts the below equations (1') and (2').

$$3.538(x1-x2)+3.11(y1-y2)+3.19(z1-z2)<0 \qquad (1')$$

$$1.9(x1-x2)+6.13(y1-y2)+3.42(z1-z2)<0 \qquad (2')$$

For example, for a case where the carrier travel layer is composed of a material in which GaN is essentially contained, when the undercoat layer contacting the carrier travel layer is composed of a material in which $In_xAl_{1-x}N$ (0.18<x<0.65) is essentially contained, it is possible to satisfy the relations of the equations (1') and (2') simultaneously. In the conventional AlGaN/GaN hetero structure, since the band gap of AlN is greater than that of GaN, the relation of the equation (2) (or equation (2')) is not satisfied.

In addition, it is possible to add n-type impurities such as Si, S and Se or p-type impurities such as Be, C and Mg to the second III-nitride semiconductor constituting the carrier travel layer. However, when the impurity concentration in the second III-nitride semiconductor is increased, the electron mobility is decreased due to the effect of Coulomb scattering and the Schottky leak is also increased. Hence, it is preferable that the impurity concentration is $1 \times 10^{17}$ cm$^{-3}$ or less. In addition, to make the carrier travel layer with the material in which GaN is essentially contained means that the lattice constant and the band gap energy of GaN are basically applied to the carrier travel layer, but another Group-III element is not precluded from being contained within a range of not imparting any influence (for example, about 0.1%), in addition to the impurities giving the conduction type. This is also applied to the structures of the other layers.

Like this, according to the invention, since the lattice constant of carrier travel layer 104 is smaller than that of undercoat layer 103, the carrier travel layer is subjected to a tensile strain, so that a piezo effect is induced. As a result, negative charges are induced at a surface side of carrier travel layer 104 and positive charges are induced at a substrate side thereof. Additionally, since the band gap of carrier travel layer 104 is smaller than that of undercoat layer 103, two-dimensional electron gas (2DEG) is formed at an interface between carrier travel layer 104 and undercoat layer 103, so that a reverse HEMT structure is made.

Source electrode 105 and drain electrode 106 are ohmic electrodes. As the material of the electrodes, it is preferable a metal that is in ohmic contact with carrier travel layer 104. For example, metals such as W, Mo, Si, Ti, Pt, Nb, Al and Au can be used. In addition, a structure having deposited a plurality of the metals may be used.

An ohmic contact layer composed of a material having a lattice constant smaller than that of the carrier travel layer can be provided between the ohmic electrodes and the carrier travel layer. When the carrier travel layer is composed of GaN, it is preferable that the ohmic contact layer is composed of a material in which $Al_zGa_{1-z}N$ ($0<z\leq1$), $In_aAl_{1-a}N$ ($0\leq a<0.18$) or a mixture thereof is essentially contained.

Gate electrode 107 formed between source electrode 105 and drain electrode 106 may be made of any metal as long as the metal can be made a Schottky-contact with carrier travel layer 104. In addition, a laminate structure of plural metals can be used as the gate electrode. Particularly, the present invention is effective to a gate length of 0.3 µm or less and it is possible to realize a micro FET having a gate length of 0.3 µm or less. When the gate length is shortened, a sectional area of the gate is inevitably reduced. Hence, in the invention, it is preferable to restrain a gate resistance from being increased by adopting a T-shape gate structure as shown.

A Schottky layer comprising a material having a band gap greater than that of the carrier travel layer can be provided between gate electrode 107 and carrier travel layer 104. For example, when the carrier travel layer is made of a material in which GaN is essentially contained, the Schottky layer can be made of a material in which $In_yAl_{1-y}N$ ($0\leq y<0.65$) is essentially contained.

Second Exemplary Embodiment

Figure 2:
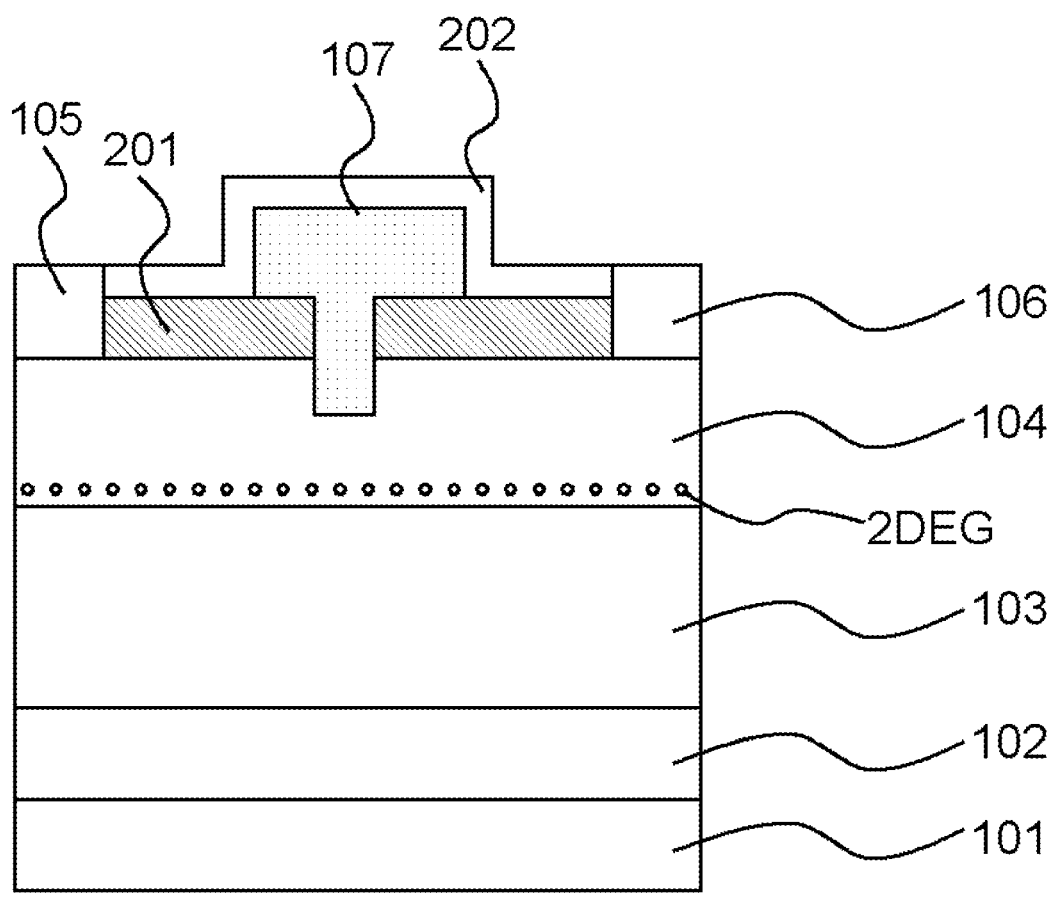
FIG. 2 is a sectional view showing a second exemplary embodiment of the invention.
Figure 3:
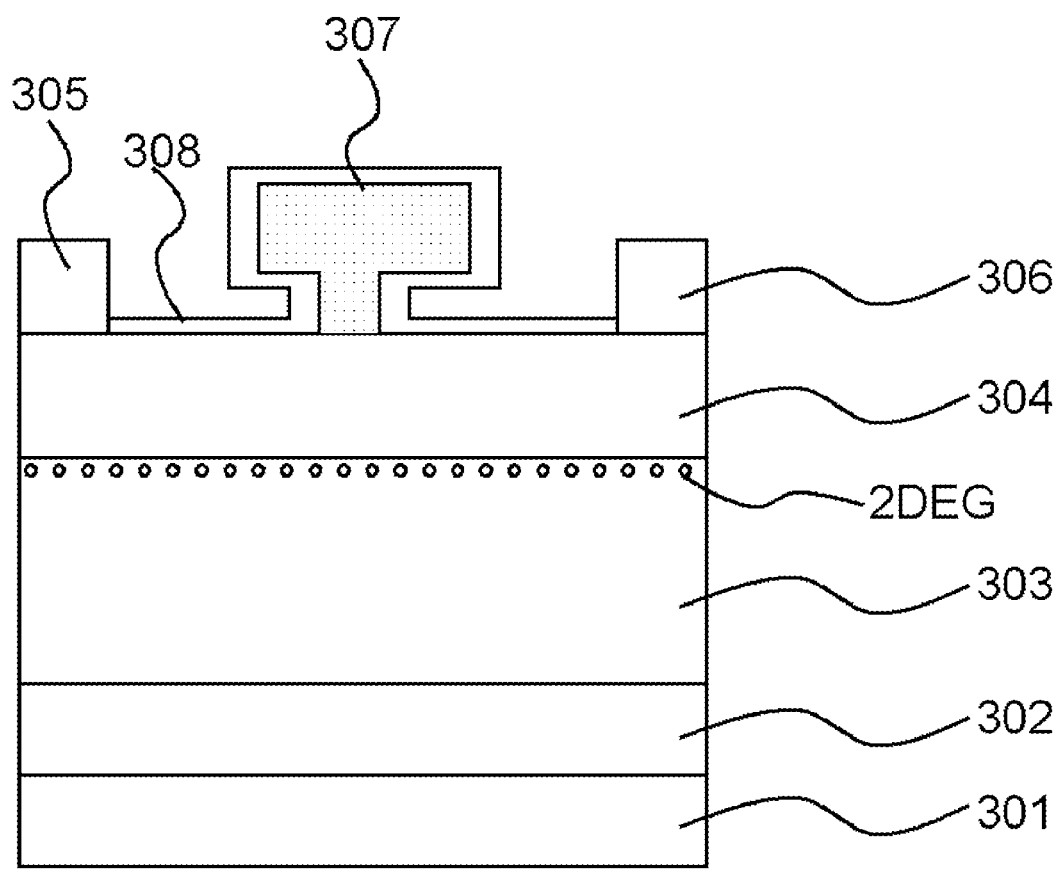
FIG. 3 is a sectional view showing the prior art.

FIG. 2 is a sectional view showing a FET structure according to a second exemplary embodiment of the invention. In FIG. 2, the layers having the same functions as those shown in FIG. 1 are indicated with the same reference numerals and the description thereof will be omitted. Likewise the first exemplary embodiment, buffer layer 102, undercoat layer 103 and carrier travel layer 104 are formed on substrate 101. Then, source electrode 105 and drain electrode 106 are formed and first insulation film 201 is also formed. After that, a part of first insulation film 201 between source electrode 105 and drain electrode 106 is removed. Furthermore, a part of carrier travel layer 104 is removed by using insulation film 201 as a mask, so that a recess structure is formed. Subsequently, gate electrode 107 is formed in the part of the recess structure and on the remaining area of first insulation film 201 so that it is formed to be longer at a side facing the drain electrode side, as compared to a side facing the source electrode side. Finally, protection film 202 is formed, so that a FET of the second exemplary embodiment is manufactured.

In addition, as first insulation film 201, a material comprising one or more of Si, Mg, Hf, Al, Ti and Ta and one or more of O and N can be used.

Further, as protection film 202, a material comprising one or more of Si, Mg, Hf, Al, Ti and Ta and one or more of O and N, or an organic material can be used.

In the second exemplary embodiment, by adopting the recess structure and the eaves structure of the gate elongated to the drain electrode (field plate structure), it is possible to relieve the concentration of electric field near the gate electrode, so that a high voltage operation is enabled.

EXAMPLES

In the followings, the invention will be more specifically described with the examples. However, it should be noted that the invention is not limited to the examples.

Example 1

An example of the first exemplary embodiment of the invention will be described. The field effect transistor of the invention is manufactured by using c-plane ((0001) plane) silicon carbide (SiC) as substrate 101, AlN layer (film thickness: 200 nm) as buffer layer 102, InAlN layer (composition ratio of In: 0.2, film thickness: 2000 nm) as undercoat layer 103, GaN layer (film thickness: 30 nm) as carrier travel layer 104, Ti/Al (film thickness of Ti layer: 10 nm, thickness of Al layer: 200 nm) as source electrode 105 and drain electrode 106 and Ni/Au (film thickness of Ni layer: 10 nm, thickness of Au layer: 200 nm) as gate electrode 107, respectively.

To be more specific, buffer layer 102 was formed by the low temperatures (for example, 400-500° C.) metalorganic vapor phase epitaxy (MOVPE) method, undercoat layer 103 and carrier travel layer 104 were formed by the typical temperatures (for example, 800-1,100° C.) MOVPE method and source electrode 105 and drain electrode 106 were formed by forming Ti/Al with electron gun deposition and lifting off and then lamp-annealing it. Then, gate electrode 107 was formed by applying photoresist, forming an opening with exposure and developing, forming Ni/Au in the opening and on the photoresist with the electron gun deposition, lifting off it and removing the photoresist.

With the above structure, since the average lattice constant of the GaN layer of carrier travel layer 104 is smaller than that of the $In_{0.2}Al_{0.8}N$ layer of undercoat layer 103, the carrier travel layer is subjected to tensile strain. In addition, since the band gap of the GaN layer is smaller than that of $In_{0.2}Al_{0.8}N$ layer, two-dimensional electron gas is formed at the undercoat layer side of the GaN layer, so that a reverse HEMT structure is made. As a result, the source/drain electrodes, which are ohmic electrodes, contact the GaN layer having the lower Schottky barrier height, as compared to the prior AlGaN layer, and there is no barrier up to the two-dimensional electron gas, so that the contact resistance could be reduced. In addition, since there is no an Al containing layer on the outermost surface, the oxidization could be suppressed and the current collapse could be also suppressed. Furthermore, since a barrier to the electrons is provided to a substrate side of the two-dimensional electron gas by forming the undercoat layer having the great band gap, the pinch-off characteristic could be improved and the short channel effect could be suppressed upon a high-frequency operation.

Meantime, although SiC was used as the substrate in this example, any substrate such as sapphire can be used. Further, although c-plane ((0001) plane) of the SiC substrate was used in this example, any plane may be possible as long as the III-nitride semiconductor is grown with c-axis being oriented and the piezo effect is generated in the direction same as the exemplary embodiments, and the plane can be inclined to about 55°. However, the larger the inclined angle, it is difficult to obtain favorable crystallinity. Hence, it is preferable that the inclined angle is 10° or less in any direction.

Likewise, although the InAlN layer was used as the undercoat layer in this example, a III-nitride semiconductor mixture of three species, i.e., GaN, InN and AlN, such as InAlGaN may be used as the undercoat layer.

Likewise, the film thickness of each layer can be arbitrarily formed. However, since the lattice constant of carrier travel layer 104 is different from the lattice constant of undercoat layer 103 in this example, it is preferable that the film thickness is a critical film thickness or less in which dislocations are generated.

Example 2

An example of the second exemplary embodiment of the invention will be described. The field effect transistor of the invention is manufactured by using c-plane ((0001) plane) silicon carbide (SiC) as substrate 101, AlN layer (film thickness: 200 nm) as buffer layer 102, InAlN layer (composition ratio of In: 0.2, film thickness: 2000 nm) as undercoat layer 103, GaN layer (film thickness: 30 nm) as carrier travel layer 104, Ti/Al (film thickness of Ti layer: 10 nm, thickness of Al layer: 200 nm) as source electrode 105 and drain electrode 106, SiON film (film thickness: 80 nm) as first insulation film 201, Ni/Au (film thickness of Ni layer: 10 nm, thickness of Au layer: 200 nm) as gate electrode 107, and SiON film (film thickness: 80 nm) as protection film 202, respectively.

To be more specific, the methods same as Example 1 were applied up to the source/drain electrodes. First insulation film 201 was formed by the CVD method. Then, the photoresist was applied and an opening was formed by exposure and developing. Through the opening, first insulation film 201 was removed by dry etching. After delaminating the resist, a part of carrier travel layer 104 was removed by using first insulation film 201 as a mask, so that a recess structure was formed. Subsequently, Ni/Au, which would be gate electrode 107, was formed in the recess part and on first insulation film 201 by the electron gun deposition. At this time, Ni/Au was formed to be longer at a side facing the drain electrode side, as compared to a side facing the source electrode side, so that gate electrode 107 was formed.

With the structure, in addition to the effects of Example 1, by adopting the recess structure and the eaves structure of the gate elongated to the drain electrode (field plate structure), it was possible to relieve the concentration of electric field near the gate electrode, so that a high voltage operation was enabled.

Further, in this example, the eaves of the gate electrode were formed to be longer at a side facing the drain electrode, as compared to a side facing the source electrode. However, since the eaves facing the source electrode are not involved in the effect of the invention, the eaves may be formed to be equal to or longer than the eaves facing the source electrode. However, if the eaves facing the source electrode are formed to be longer, the gain is much decreased as the gate capacity is increased, with regard to the effects of improving the breakdown characteristics or decreasing the current collapse. Hence, it is preferable that the eaves facing the source electrode are shorter than the eaves facing the drain electrode.

While the invention has been shown and described with reference to the exemplary embodiments and examples, it will be understood by those skilled in the art that the invention is not limited thereto and that various changes may be made thereto without departing from the spirit and scope of the invention as defined by the following claims.

What is claimed is:

1. A field effect transistor comprising:
   a substrate;
   an undercoat layer of a first III-nitride semiconductor that is a wurtzite type being (0001) plane as a main plane on the substrate;
   a carrier travel layer of a second III-nitride semiconductor that is a wurtzite type being (0001) plane as a main plane on the undercoat layer;
   source/drain electrodes in ohmic contact, and a gate electrode in Schottky contact, with the carrier travel layer, which are formed directly or via another layer on the carrier travel layer, and
   wherein the undercoat layer has an average lattice constant greater than that of the carrier travel layer, and a band gap greater than that of the carrier travel layer.

2. The field effect transistor according to claim 1, wherein the field effect transistor forms two-dimensional electron gas at a side of the carrier travel layer facing the undercoat layer when applying an electric field.

3. The field effect transistor according to claim 1, wherein the carrier travel layers comprises $In_{x1}Al_{y1}Ga_{z1}N$ (x1+y1+z1=1) and the undercoat layer comprises $In_{x2}Al_{y2}Ga_{z2}N$ (x2+y2+z2=1), and
   wherein the two layers are made of components that satisfy the equations (1) and (2) at the same time:

$$LP_{In}(x1-x2)+LP_{Al}(y1-y2)+LP_{Ga}(z1-z2)<0 \quad (1)$$

$$BG_{In}(x1-x2)+BG_{Al}(y1-y2)+BG_{Ga}(z1-z2)<0 \quad (2)$$

in the above equations, $LP_{In}$, $LP_{Al}$ and $LP_{Ga}$ denote the lattice constants of InN, AlN and GaN, respectively and $BG_{In}$, $BG_{Al}$ and $BG_{Ga}$ indicate the band gap energies of InN, AlN and GaN, respectively.

4. The field effect transistor according to claim 3, wherein the carrier travel layer comprises GaN as a main component and the undercoat layer comprises $In_xAl_{1-x}N$ (0.18<x<0.65) as a main component.

5. The field effect transistor according to claim 1, further comprising a Schottky layer, between the gate electrode and the carrier travel layer, which comprises a material having a band gap greater than that of the carrier travel layer.

6. The field effect transistor according to claim 5, wherein the carrier travel layer comprises GaN as a main component and the Schottky layer comprises $In_yAl_{1-y}N$ (0≦y<0.65) as a main component.

7. The field effect transistor according to claim 1, further comprising an ohmic contact layer, between the source/drain electrodes and the carrier travel layer, which comprises a material having an average lattice constant smaller than that of the carrier travel layer.

8. The field effect transistor according to claim 7, wherein the carrier travel layer comprises GaN as a main component and the ohmic contact layer comprises $Al_zGa_{1-z}N$ (0<z1), $In_aAl_{1-a}N$ (0≦a<0.18) or a mixture thereof as a main component.

9. The field effect transistor according to claim 1, further comprising a first insulation film having an opening on the carrier travel layer; and
   wherein the gate electrode is provided in a recess that is formed in the carrier travel layer through the opening of the first insulation film.

* * * * *